United States Patent [19]

Günter

[11] Patent Number: 5,502,890
[45] Date of Patent: Apr. 2, 1996

[54] PROCESS FOR DETERMINING THE POSITION AND COPLANARITY OF THE LEADS OF COMPONENTS

[75] Inventor: Doemens Günter, Holzkirchen, Germany

[73] Assignee: Siemens Aktiengesellschaft, Munich, Germany

[21] Appl. No.: 307,749

[22] PCT Filed: Mar. 8, 1993

[86] PCT No.: PCT/DE93/00208

§ 371 Date: Sep. 26, 1994

§ 102(e) Date: Sep. 26, 1994

[87] PCT Pub. No.: WO93/19577

PCT Pub. Date: Sep. 30, 1993

[30] Foreign Application Priority Data

Mar. 24, 1992 [DE] Germany .......................... 42 09 524.7

[51] Int. Cl.⁶ .............................. H05K 3/30; B23P 21/00
[52] U.S. Cl. ............................... 29/833; 29/721; 29/740; 29/759
[58] Field of Search ............................. 29/740, 833, 759; 228/180.21, 721

[56] References Cited

U.S. PATENT DOCUMENTS

| | | | |
|---|---|---|---|
| 4,404,741 | 9/1983 | Lebet et al. | 29/740 X |
| 4,727,645 | 3/1988 | Rodin et al. | 29/740 |
| 4,793,707 | 12/1988 | Hata et al. | 29/721 X |
| 4,867,569 | 9/1989 | MoHara | 29/721 X |
| 4,951,383 | 8/1990 | Amao et al. | 29/833 X |
| 4,979,290 | 12/1990 | Chiba | 228/180.21 X |
| 5,044,072 | 9/1991 | Blais et al. | 29/759 X |
| 5,113,565 | 5/1992 | Cipolla | 228/180.21 X |
| 5,214,841 | 6/1993 | Howard et al. | 29/740 X |
| 5,249,349 | 10/1993 | Kuinose et al. | 29/833 X |
| 5,249,356 | 10/1993 | Okuda et al. | 29/740 X |
| 5,251,266 | 10/1993 | Spigarelli et al. | 29/740 X |
| 5,379,514 | 1/1995 | Okuda et al. | 29/833 |

FOREIGN PATENT DOCUMENTS

| | | |
|---|---|---|
| 0320317 | 6/1989 | European Pat. Off. . |
| 0449481A1 | 2/1991 | European Pat. Off. . |
| 3340084C2 | 10/1985 | Germany . |
| 3546216A1 | 7/1986 | Germany . |
| 5-218693 | 8/1993 | Japan ......................... 29/740 |
| 2221297 | 1/1990 | United Kingdom . |
| 91/13535 | 9/1991 | WIPO ........................ 29/833 |
| WO91/15104 | 10/1991 | WIPO . |

OTHER PUBLICATIONS

DiLorenzo et al., "Component Position Recognition Method and Device for an Assembly Robot" IBM Technical Disclosure Bulletin, vol. 26, No. 7B, Dec. 1983, pp. 3664–3666.
Patents Abstracts of Japan, E–1142, Dec. 6, 1991, vol. 15/No. 482 of Japanese Patent, 3–208400, Nov. 9, 1991.

Primary Examiner—Carl J. Arbes
Attorney, Agent, or Firm—Hill, Steadman & Simpson

[57] ABSTRACT

In order to determine the position and/or to check the separation of the leads (A) of components (B), a direct shadow of the region of the leads at one side of the component is generated on the photosensitive surface of a local resolution optoelectronic transducer (W4). If in each case one shadow is generated successively from two different directions, the coplanarity of the leads (A) may also be checked. Preferably, the local resolution optoelectronic transducer (W4) and the light sources for casting the shadow are directly secured to the equipping head (BK4). By integrating the determination system into the equipping head, the lead position can be determined and the separation and coplanarity of the leads can be checked without delay.

18 Claims, 4 Drawing Sheets

PROCESS FOR DETERMINING THE POSITION AND COPLANARITY OF THE LEADS OF COMPONENTS

BACKGROUND OF THE INVENTION

1. Field of the Invention

The present invention relates generally to a method and apparatus for checking the position of leads on an electrical component.

2. Description of the Related Art

In the automatic equipping of printed circuit boards or ceramic substrates with SMD components, the individual components are removed from a magazine or a feeding device by means of a equipping head and are then positioned in a predetermined position on the printed circuit board or the ceramic substrate. Since the components exhibit, in the magazine or in the collection position of a feeding device, a position tolerance of approximately 1 mm, but must be positioned on the printed circuit board or the ceramic substrate with high accuracy, an automatic determination of position and correction are necessary. Furthermore, especially in the case of SMD components with a large number of pins, the separation and the coplanarity of the leads must be checked. The determination of position and the checking of separation and coplanarity should in this case take as little time as possible, in order to permit a high degree of equipping performance of the automatic equipping system. Increasing component dimensions of up to 70×70 mm, decreasing separation of the leads of down to 0.3 mm and stringent requirements placed upon the speed of equipping create considerable difficulties in achieving the mentioned objects.

Known arrangements for determining the position and checking the separation of the leads of components obtain the image of the component or sections of the component, by means of an objective lens, onto a planar CCD camera and ascertain, using digital image processing, the position of the component leads and the separation of the leads. With such arrangements, a coplanarity check is not possible.

In other known arrangements for determining the position and checking the separation of the leads of components, the components are placed onto an optically transparent plate, on which a shadow of the illuminated leads is generated. The shadow edges of the leads are then imaged from below by means of an objective lens onto a planar CCD camera, so that in this case also, again, the position of the component leads and the separation of the leads can be ascertained using digital image processing. A coplanarity check is made possible using these arrangements in that the leads are successively illuminated from two different directions (cf. European Patent Application 0 425 722 and PCT Published Application 91/15104).

As a result of the increasing component size, as well as the more stringent requirements imposed on accuracy and the required short determination times, significant limits are placed on a use of the known arrangements for determining the position, checking the separation and possibly checking the coplanarity of the leads of components, since:

In the case of a dimensioning of the components of for example 70×70 mm, a CCD camera having 4000×4000 pixels would be necessary.

The read-out time of the corresponding information, at approximately 1 s, lasts far too long and is far too great for rapid processing.

It is necessary to provide objective lenses which while having a field of view of 70×70 mm exhibit a freedom from distortion of 5 micrometers. Such objectives can be produced only at high cost and are heavy and large.

On account of the weight and size of the illuminating device and of the objective lens, the known arrangements for determining the position and checking the separation can scarcely be integrated into the equipping head of an automatic equipping system; in this case, such an integration is definitely to be ruled out with respect to a certain size of the components. The solution which is optimal with regard to the equipping time, involving a determination of position and checking during the shortest equipping path between component removal and component positioning, cannot then be implemented.

German Patent Application 35 46 216 discloses an arrangement for determining the position of components, in which arrangement the equipping head brings up an image sensor, such as for example a television camera, and the image sensor then records an image of the component at the suction pipette of the equipping head. According to a variant, it is also to be possible to fit the image sensor on the equipping head. Having regard to the overall volume and the weight of the image sensor, this variant could however at best be feasible for the equipping of small components.

German Patent Application 33 40 084 discloses a device for the equipping of printed circuit boards or ceramic substrates with components, in which device the equipping head brings up a position pickup device, in which a relative displacement of the component in relation to a theoretical position related to the positioning axis of the equipping head is ascertained. The position pickup device includes a frame, which is provided along one frame side with a series of mutually adjacent, radiation-emitting elements and along the opposite frame side with a series of mutually adjacent elements receiving the mentioned radiation. If now a component held at the suction pipette of the equipping head is transported into the frame, then the centrally disposed receiving elements lie in the shadow of the component. The ratio of the left-hand and the right-hand receiving elements, which receive a beam, forms a measure of the eccentricity of the component in the corresponding direction.

SUMMARY OF THE INVENTION

The invention is based on the problem of reducing the constructional effort required for determining the position and/or checking the separation and/or checking the coplanarity of the leads of components and of permitting a rapid processing.

The solutions to this problem are based on the common concept of generating on the photosensitive surface of a local resolution optoelectronic transducer a direct shadow of the region of the leads at one side of a component. As a result of this direct shadow, it is possible to entirely dispense with an optical imaging system.

In the case of the first solution, parallel light is used for the generation of the direct shadow. The position of the shadow edges of the leads on the local resolution optoelectronic transducer then permits a rapid determination of position and checking of separation. The process can be used for the checking of the separation of the leads in quality control or for determining the position and checking the separation in the automatic planting of components.

According to the second solution which is especially suitable for SMD planting, parallel light is again used for the generation of the direct shadow, but in this case the local resolution optoelectronic sensor is secured to the equipping head. The light source generating the parallel light can then be brought up by the equipping head or alternatively can likewise be secured to the equipping head.

According to the third solution, in each case one direct shadow of the region of the leads at one side of a component is generated successively by illumination from two different directions on the photosensitive surface of the local resolution optoelectronic transducer. Besides the determination of position and checking of separation, this additionally also permits a checking of the coplanarity of the leads. The process can be used for checking the separation and checking the coplanarity in quality control or for determining the position, checking the separation and checking the coplanarity in the automatic equipping of components.

According to the solution fourth which is especially suitable for SMD planting, in each case one direct shadow of the region of the leads at one side of a component is generated successively again by illumination from two different directions on the photosensitive surface of the local resolution optoelectronic transducer; in this case, however, the local resolution optoelectronic transducer is secured to the equipping head. The illumination from two different directions can be undertaken by a device which is to be brought up by the equipping head or by a device fitted to the equipping head.

According to the sixth solution, a equipping head for the automatic equipping of printed circuit boards or ceramic substrates with components is equipped with a suction pipette, a local resolution optoelectronic transducer and at least one light source; in this case, using the light source, in each case one direct shadow of the region of the leads at one side of a component is generated successively on the photosensitive surface of the local resolution optoelectronic transducer from two different directions. As a result of the described constructional measures, a determination of position, checking of the separation and coplanarity of the leads of the components picked up by the suction pipette are made possible, in which case these procedures are carried out in the path from the component preparation device to the equipping position in the equipping head and thus do not require any additional time. Further advantageous refinements of the processes according to the invention and advantageous refinements of the equipping head according to the invention are set out below.

The local resolution optoelectronic transducer can be formed just by one single photodiode, provided that the latter is displaceable in two mutually perpendicular directions.

The further development of the process concerns a particularly preferred formation of the local resolution optoelectronic transducer by a line of photodiodes which is displaceable perpendicular to the line direction. Since lines of photodiodes are commercially available, even in the length required for particularly large components, this solution is feasible with a particularly low expenditure. It is in this case expedient to use a line of photodiodes, the individual photodiodes of which have rectangular photosensitive surfaces which are arranged so that the long edge of the rectangle is perpendicular to the line direction. Such lines of photodiodes are particularly insensitive to dust.

A photodiode matrix can also be used as a local resolution optoelectronic transducer, i.e. in this case it is possible to dispense with movement of individual photodiodes or of a line of photodiodes.

Another refinement permits a determination of position, checking of separation and checking of coplanarity of the leads of components by central projection from two different directions. In this case, a particularly low expenditure is required if two point light sources disposed at a spacing from one another are used for the central projection from two different directions.

An additional refinement concerns the use of a laser diode as point light source. Such laser diodes are economical and moreover are distinguished by low weight and by a good point characteristic.

If the point light source is fitted to the equipping head, then determination of position, checking of separation and checking of coplanarity of the leads of the components can be carried out without delay on the shortest equipping path between component removal and component positioning. It is then particularly favorable if the point light source is displaced synchronously with the line of photodiodes perpendicular to its line direction. As a result of this measure, a precise shadow of the entire region of the leads at one side of a component is guaranteed with a small expenditure.

Yet another refinement permits, by a simple rotation of the respective component in steps of 90° and 180°, an encompassing of all lead regions. This rotation can then be undertaken, without additional expenditure with the aid of the suction pipette of a equipping head.

More refinements concern the fitting of a line of photodiodes which is displaceable perpendicular to its line direction to the equipping head. As has already been mentioned, lines of photodiodes are commercially available even in the length required for particularly large components, so that the realization of the local resolution optoelectronic transducer in this case requires a particularly low expenditure. In these circumstances, in this case also again, a design which is particularly resistant to dust is obtained if the individual photodiodes of the line of photodiodes exhibit a rectangular photosensitive surface which is elongate perpendicular to the line direction.

It is particularly favorable to fit to the equipping head a point light source, preferably two point light sources which are disposed at a spacing from one another. In this case, here also again two laser diodes disposed at a spacing from one another are to be preferred having regard to the low expenditure on cost, the low weight and the good point characteristic to other point light sources.

A further refinement permits a particularly simple synchronous displacement of the point light sources and of the line of photodiodes.

BRIEF DESCRIPTION OF THE DRAWINGS

Embodiments of the invention are shown in the drawings and are described in greater detail hereinbelow.

In the drawings.

DETAILED DESCRIPTION OF THE PREFERRED EMBODIMENTS

Figure 1:
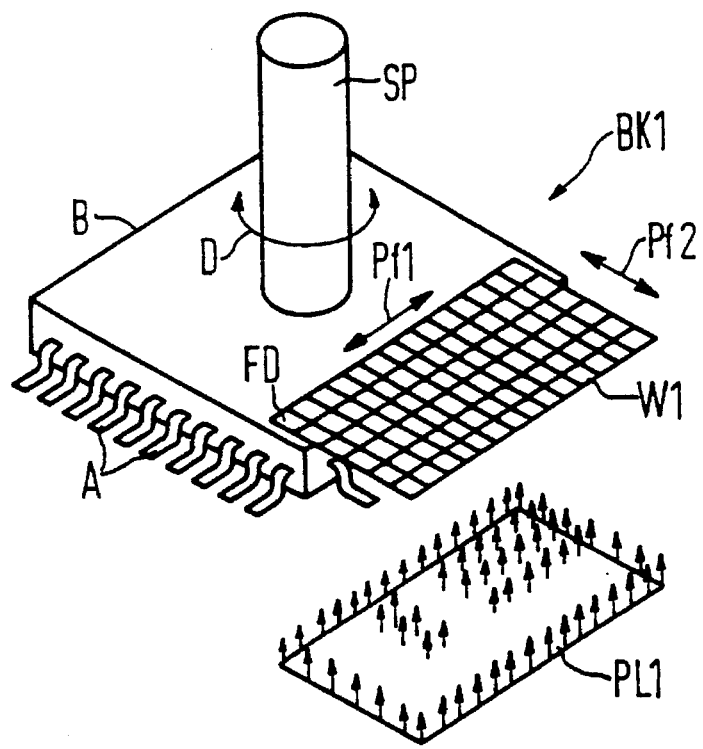
FIG. 1 shows the basic principle for determining the position and checking the separation of the leads of components, in the case of which basic principle a direct shadow of the region of the leads at one side of a component is generated by illumination with parallel light on the photosensitive surface of a local resolution optoelectronic transducer.

FIG. 1 shows, in greatly simplified diagrammatic representation, an equipping head BK1, the suction pipette SP of which carries a component B. The shown component B comprises a quad flat pack, which possesses ten leads A on each side of the component. A local resolution optoelectronic transducer W1 is secured to the equipping head BK1 in such a manner that by illumination with a parallel light PL1 a direct shadow of the region of the leads at one side of the component is generated on its photosensitive surface. From the position of the shadow edges of the leads A on the local resolution optoelectronic transducer W1 it is then possible to ascertain the position of the leads A, for example, in relation to the axis of symmetry of the suction pipette SP and also to check the separation of the leads A. By rotation of the component B relative to the local resolution optoelectronic transducer W1 in steps of 90°, the regions of the leads of the remaining three sides of the component can be encompassed for position determination and separation checking. This rotation, indicated by a double arrow D, of the component B is undertaken by a corresponding rotation of the suction pipette SP.

The photosensitive surface of the local resolution optoelectronic transducer W1 shown in FIG. 1 extends in the direction of the double arrow Pf1 parallel to the pertinent component edge over the region of the leads A and perpendicularly thereto in the direction of the double arrow Pf2. The extent of the photosensitive surface in the direction of the double arrow Pf2 is necessary having regard to any possible rotations of the component B, since such rotations prevent a precise parallel alignment of the component edge and transducer W1.

The photosensitive surface of the local resolution optoelectronic transducer W1 can be generated by a single photodiode FD, which is correspondingly displaced in the direction of the double arrows Pf1 and Pf2. The photosensitive surface of the local resolution optoelectronic transducer W1 can however also be generated by a line of photodiodes which extends in the direction of the double arrow Pf1 and which is displaced in the direction of the double arrow Pf2. Furthermore, the photosensitive surface of the local resolution optoelectronic transducer W1 can be formed by a photodiode matrix, the lines and columns of which extend in the direction of the double arrows Pf1 and Pf2.

The parallel light PL1 for the generation of a direct shadow of the region of the leads at one side of a component on the photosensitive surface of the local resolution optoelectronic transducer W1 is indicated in FIG. 1 by a plurality of arrows, which are aligned in matrix fashion corresponding to the directions Pf1 and Pf2. The generation of the parallel light PL1 can in this case also be realized by movement of a single light source in the direction of the double arrows Pf1 and Pf2 or by movement of a linear arrangement, extending in the direction of the double arrow Pf1, of light sources in the direction of the double arrow Pf2. The device which generates the parallel light PL1 can be either brought up by the equipping head BK1 or directly secured to the equipping head BK1.

Figure 2:
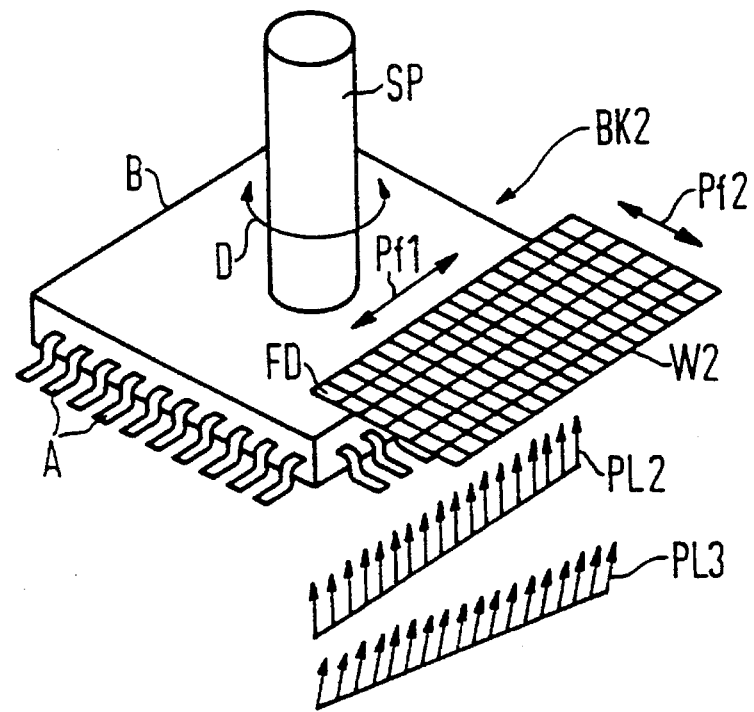
FIG. 2 shows the basic principle of a first embodiment for determining position, checking separation and checking coplanarity of the leads of components, in the case of which basic principle in each case one direct shadow of the region of the leads at one side of a component is generated successively by illumination with parallel light from two different directions on the photosensitive surface of a local resolution optoelectronic transducer.

FIG. 2 shows, in greatly simplified diagrammatic representation, an equipping head BK2, the suction pipette SP of which carries a component B. A local resolution optoelectronic transducer W2 is secured to the equipping head BK2 in such a manner that by illumination with parallel light PL2 and PL3 from two different directions in each case one direct shadow of the region of the leads at one side of the component is generated on its photosensitive surface successively. From the differing position of corresponding shadow edges of the leads A on the photosensitive surface of the local resolution optoelectronic transducer W2, it is then possible to compute the spatial position of the leads A. The computation of the spatial position of the leads A comprises a determination of position as well as a checking of separation and coplanarity.

By rotation D of the component B relative to the local resolution optoelectronic transducer W2 in steps of 90°, the regions of the leads at the remaining three sides of the component can be encompassed for determination of position as well as checking separation and coplanarity. This rotation D of the component B is in this case also again undertaken with the aid of the suction pipette SP.

With respect to the construction and the mode of operation of the local resolution optoelectronic transducer W2, reference is made to the statements concerning the local resolution optoelectronic transducer W1 of the equipping head BK1 shown in FIG. 1.

The parallel light PL2 and PL3 is indicated in FIG. 2 by two groups of arrows of differing direction. The generation of the parallel light PL2 and PL3 can for example be undertaken by a linear arrangement of corresponding light sources, which are possibly moved in the direction of the double arrow Pf2. The corresponding light sources can either be brought up by the equipping head BK2 or be directly secured to the equipping head BK2.

Figure 3:
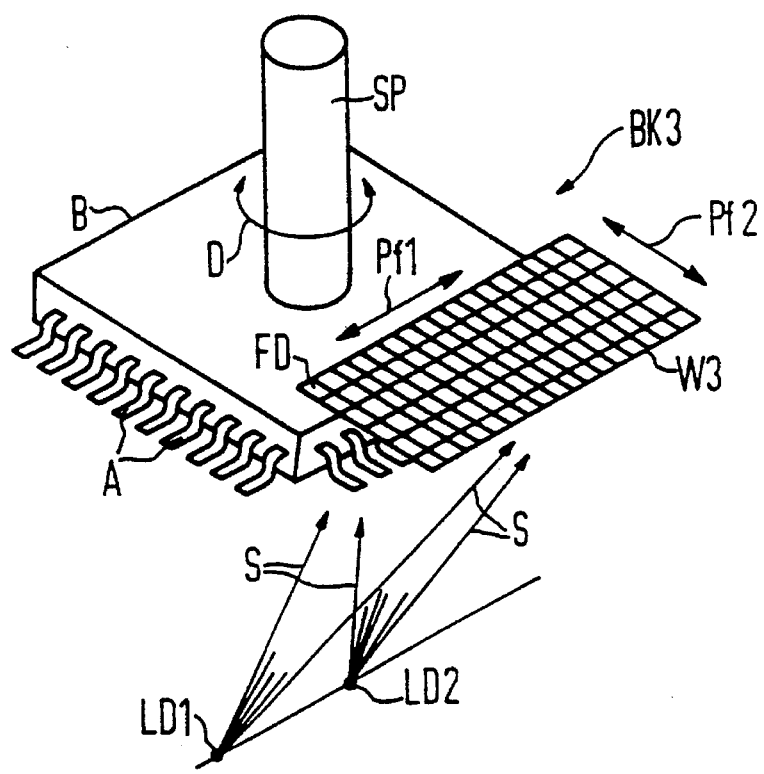
FIG. 3 shows the basic principle of an embodiment for determining position, checking separation and checking coplanarity of the leads of components, in the case of which embodiment in each case one shadow of the region of the leads at one side of a component is generated successively by central projection from two different directions on the photosensitive surface of a local resolution optoelectronic transducer.

FIG. 3 shows, in greatly simplified diagrammatic representation, an equipping head BK3, the suction pipette SP of which carries a component B. A local resolution optoelectronic transducer W3 is secured to the equipping head BK3 in such a manner that by central projection from two different directions in each case one direct shadow of the region of the leads at one side of the component is generated successively on its photosensitive surface. From the differing position of corresponding shadow edges of the leads A on the photosensitive surface of the local resolution optoelectronic transducer W3 it is then possible to compute the spatial position of the leads A by using the laws of geometrical optics. This computation is explained later in detail with reference to FIGS. 7 and 8. The computation of the spatial position of the leads A then comprises, in this case also again, a determination of position as well as a checking of separation and coplanarity.

By rotation D of the component B relative to the local resolution optoelectronic transducer W3 in steps of 90°, the regions of the leads at the remaining three sides of the component can be encompassed for determination of position as well as checking of separation and coplanarity. This rotation D of the component B is, in this case also again, undertaken with the aid of the suction pipette SP.

With respect to the construction and the mode of operation of the local resolution optoelectronic transducer W3, reference is made to the corresponding statements concerning the local resolution optoelectronic transducer W1 of the planting head BK1 shown in FIG. 1.

The abovementioned central projection from two different directions is effected by two laser diodes LD1 and LD2 disposed at a spacing from one another. These laser diodes LD1 and LD2 which are fitted to the planting head BK3 are—as is indicated by arrows S—to generate successively in each case one direct shadow of the region of the leads at one side of the component on the photosensitive surface of the local resolution optoelectronic transducer W3. Since the laser diodes LD1 and LD2 comprise point light sources, there is here in each instance a shadow due to central projection.

Figure 4:
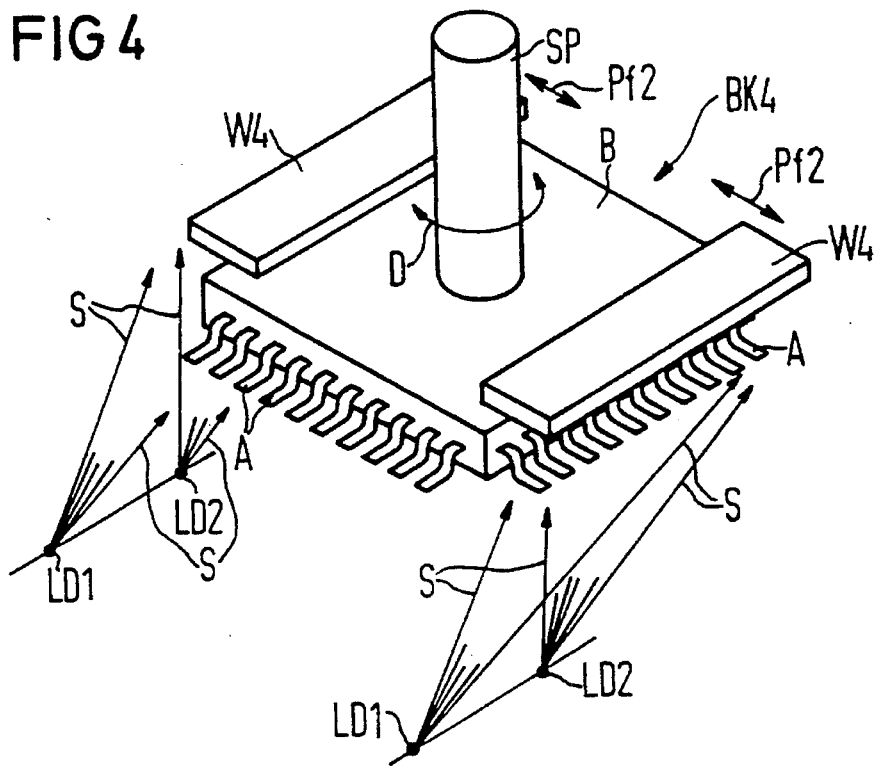
FIG. 4 shows a variant of the embodiment shown in FIG. 3, in the case of which a line of photodiodes which is displaceable perpendicular to the line direction is used as local resolution optoelectronic transducer.

FIG. 4 shows a variant of the equipping head shown in FIG. 3. The equipping head, designated here by BK4, carries at mutually opposite sides in each case one local resolution optoelectronic transducer W4. The two local resolution optoelectronic transducers W4 are in each instance formed by a line of photodiodes which is displaceable perpendicular to its line direction, i.e. in the direction of the double arrows Pf2. In each instance, two laser diodes LD1 and LD2 which are disposed at a spacing from one another are associated with the two lines of photodiodes.

In the embodiment shown in FIG. 4, by a once-only rotation D of the component B relative to the two local resolution optoelectronic transducers W4 through 90°, the remaining two component sides can also be encompassed for determining the position as well as checking the separation and coplanarity of the leads.

Figure 5:
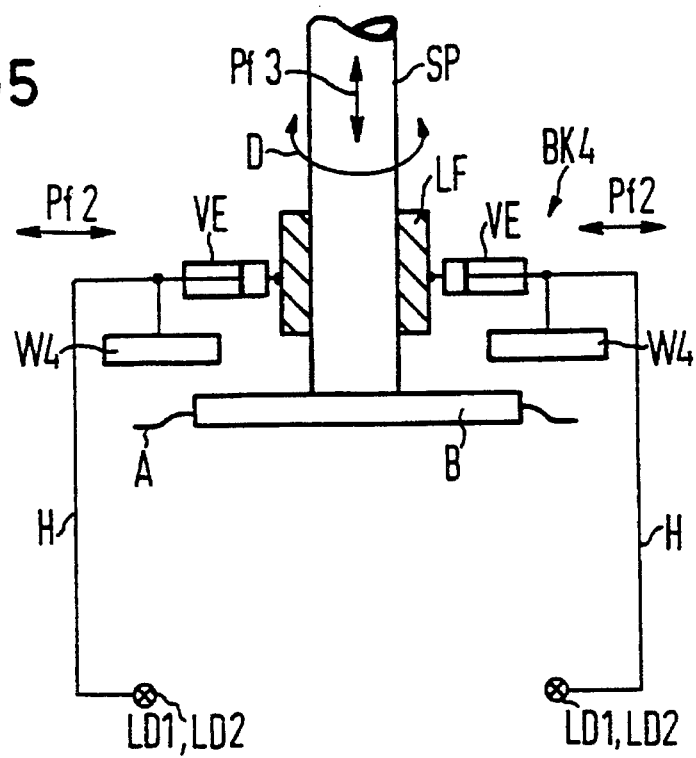
FIG. 5 and FIG. 6 show the arrangement of the line of photodiodes and point light sources corresponding to the variant shown in FIG. 4 in the checking procedure and in the planting procedure.
Figure 6:
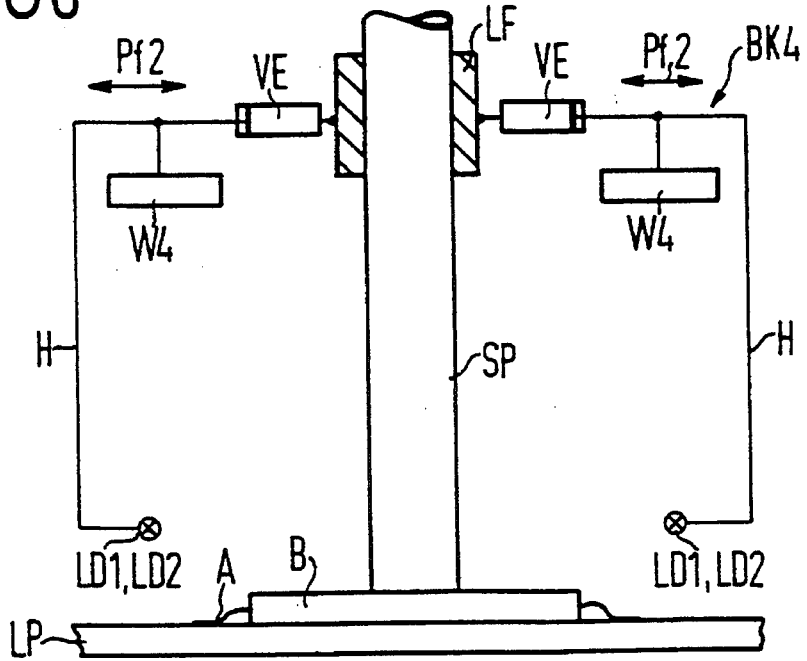

FIGS. 5 and 6 show, in greatly simplified diagrammatic representation for the equipping head BK4 shown in FIG. 4, the arrangement of lines of photodiodes and light sources in the checking procedure and in the equipping procedure. It can be seen that the local resolution optoelectronic transducers W4 and the two associated laser diodes LD1 and LD2, lying one behind the other perpendicular to the plane of the drawing, are secured in each instance to a common mounting H. The mutually opposite mountings H are displaceable by means of shifting devices VE in the direction of the double arrows Pf2, i.e. in the course of the checking procedure the local resolution optoelectronic transducers W4 are displaced synchronously with the associated laser diodes LD1 and LD2 relative to the leads A to be encompassed. The shifting devices VE are fitted to a longitudinal guide LF, in which the suction pipette SP is mounted to be raisable and lowerable in the direction of the double arrow Pf3 and rotatable in the direction of the double arrow D.

After the position determination and checking procedure shown in FIG. 5, the two mountings H are displaced radially outwardly according to FIG. 6, so that the component B can be deposited without obstruction at the predetermined equipping position of a printed circuit board LP by lowering the suction pipette SP. In the course of this positioning of the component B on the printed circuit board LP, the result of the previously performed determination of position is taken into account, as appropriate, by a corresponding correction. This correction can include both a displacement and a rotation of the component B relative to the printed circuit board LP.

Figure 7:
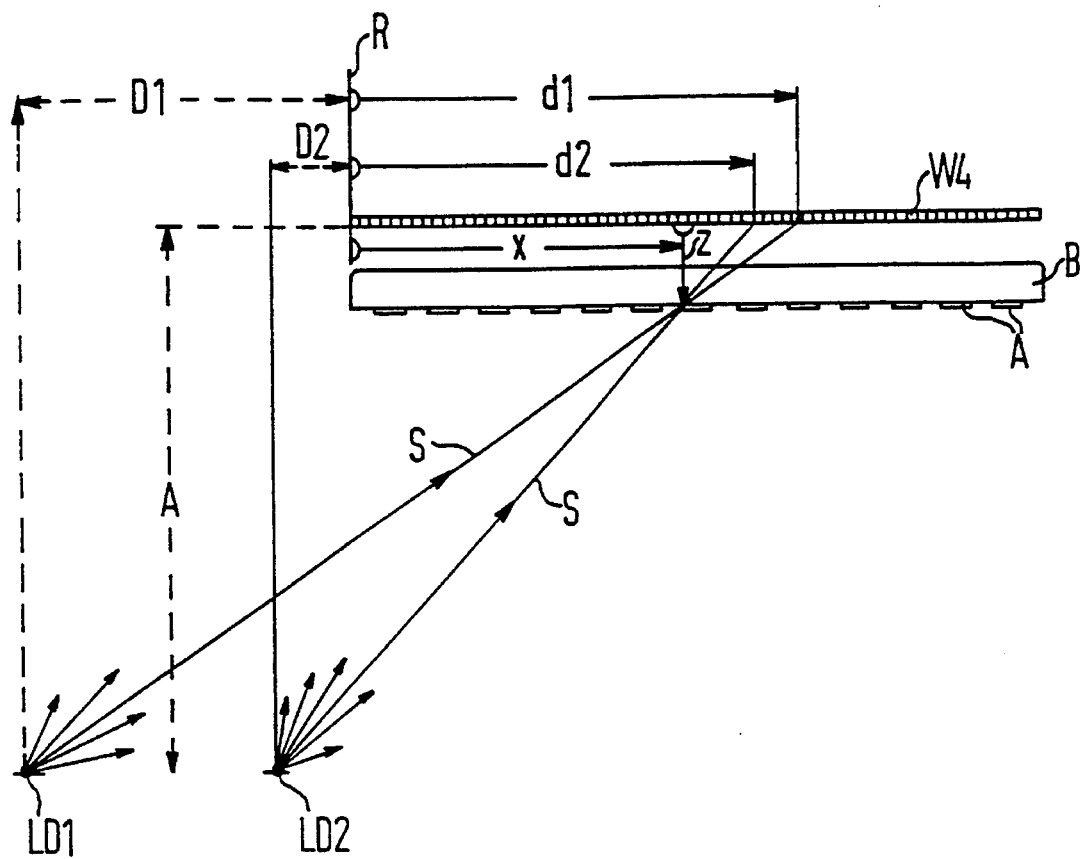
FIGS. 7 and 8 show the ascertainment of the spatial position of the leads of a component according to the variant shown in FIG. 4.
Figure 8:
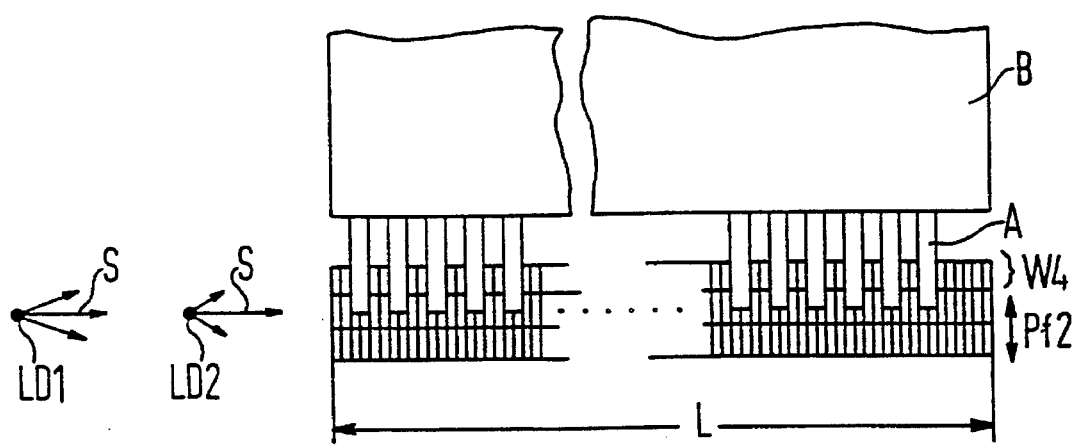

FIGS. 7 and 8 show, for the equipping head BK4 described hereinabove with reference to FIGS. 4, 5 and 6, the ascertainment of the spatial position of the leads A of a component B. FIG. 7 shows the local resolution optoelectronic transducer W4 which is formed by a line of photodiodes, the component B, disposed immediately therebelow, with the leads A and, below the same, the two laser diodes LD1 and LD2 disposed at a spacing from one another. The length, designated in FIG. 8 by L, of the line of photodiodes is in this case coordinated with the length of the component B.

In the vertical direction, the spacing between the lower side of the line of photodiodes and the two laser diodes LD1 and LD2 is designated by A. In the horizontal direction, the spacing between the laser diodes LD1 and LD2 and the margin R, on the left in FIG. 7, of the line of photodiodes is designated D1 and D2 respectively. The shadow edges, generated successively by the radiation S of the laser diodes LD1 and LD2 on the line of photodiodes, of a specified lead A exhibit a spacing d1 and a spacing d2 respectively from the left-hand margin R of the line of photodiodes in the horizontal direction. The horizontal spacing of this specified lead A from the left-hand margin R is shown by the coordinate x, while in the vertical direction the spacing of the leads A from the lower side of the line of photodiodes is shown by the coordinate z. As a result of the ascertainment of the coordinates x, a determination of position and a checking of separation of the leads A can be performed, while the coordinates z of the leads A permit a check of coplanarity.

With the aid of the predetermined dimensions A, D1 and D2 and of the dimensions d1 and d2 recorded by the line of photodiodes, it is possible to compute for the determination of position, checking of separation and coplanarity the coordinates x and z with the aid of the relations $$x = \frac{d1 \cdot D2 - d2 \cdot D1}{(D2 - D1) + (d2 - d1)}$$

and $$z = \frac{A(d2 - x)}{D2 + d2}$$

It can also be seen from FIG. 8 that the transducer W4 formed by a line of photodiodes exhibits rectangular photodiodes FD and is displaceable in the direction of the double arrows Pf2. As a result of this displaceability, an unambiguous shadow of the leads A is guaranteed, even in the event of a rotation of the component B. Moreover, the displacement of the line of photodiodes also permits the ascertainment of the rotation of a component B, so that also any possible rotations can be corrected in the course of the positioning on a printed circuit board.

In the case of the preferred embodiment described hereinabove with reference to FIGS. 4 to 8, lines of photodiodes from the company Reticon, Sunnyvale, Calif., USA with the designation RL 4096 N are used as the local resolution optoelectronic transducers W. These lines of photodiodes comprise in each instance 4096 individual photodiodes disposed in a row; in this case, the photosensitive surfaces of the individual photodiodes exhibit dimensions of 15×16 micrometers. The length of a line of photodiodes is 60 mm. Laser diodes from the company Hitachi Ltd, Tokyo, Japan with the designation HL 6711 C are used as the point light sources or laser diodes LD1 and LD2. These laser diodes exhibit a power of 5 mW and emit light having a wavelength of 670 nm. As a result of the large number of individual photodiodes in the line of photodiodes, it is guaranteed that at high resolution only the necessary information is recorded and can be read out in the shortest time of, for example, 2 ms.

By way of departure from the described embodiments, in the case of specified equipping heads it can also be expedient to exchange the arrangement of lines of photodiodes and laser diodes. In this case, the laser diodes are fitted to the equipping head above the component and the lines of photodiodes are fitted to the equipping head below the component.

Although other modifications and changes may be suggested by those skilled in the art, it is the intention of the inventors to embody within the patent warranted hereon all changes and modifications as reasonably and properly come within the scope of their contribution to the art.

I claim:

1. A process for determining position and/or checking separation and/or checking coplanarity of leads of components, which are removed from a predetermined removal position of a component preparation device by means of an equipping and are positioned in a predetermined position on a printed circuit board or a ceramic substrate, comprising the steps of:

successively illuminating one side of the component from two different directions;

generating in each case one direct shadow of a region of the leads at the one side of the component on the photosensitive surface of a local resolution optoelectronic transducer fitted to the equipping head, and computing a spatial position of the leads from differing position of corresponding shadow edges of the leads on the optoelectronic transducer.

2. A process as claimed in claim 1, wherein said local resolution optoelectronic transducer comprises a line of photodiodes which is displaceable perpendicular to a line direction.

3. A process as claimed in claim 2, wherein said line of photodiodes comprises individual photodiodes which exhibit rectangular photosensitive surfaces which are elongated perpendicular to a line direction.

4. A process as claimed in claim 1, wherein said local resolution optoelectronic transducer comprises a photodiode matrix.

5. A process as claimed in claim 1, wherein said illumination from two directions uses at least one point light source.

6. A process as claimed in claim 5, wherein said illumination from two directions uses two point light sources which are disposed at a spacing from one another.

7. A process as claimed in claim 5, wherein said point light source comprises a laser diode.

8. A process as claimed in claim 1, wherein said illumination from two different directions uses at least one point light source fitted to the equipping head.

9. A process as claimed in claims 2, further comprising the step of:

displacing the point light source synchronously with a line of photodiodes perpendicular to its line direction.

10. A process as claimed in claim 1, further comprising the step of:

rotating the component relative to the local resolution optoelectronic transducer in steps of 90° or 180° to encompass all lead regions.

11. A process as claimed in claim 10, wherein said step of rotating comprises rotating the component by a suction pipette of the equipping head.

12. An equipping head for the automatic equipping of printed circuit boards or ceramic substrates with components, comprising:

a suction pipette to take up, transport and position the components, a local resolution optoelectronic transducer and having at least one light source, in which the light source generates successively in each case one direct shadow of a region of the leads at one component side of a component taken up by the suction pipette by illumination from two different directions on a photosensitive surface of the local resolution optoelectronic transducer and a spatial position of the leads is computed from differing positions of corresponding shadow edges of the leads of the component on the optoelectronic transducer.

13. An equipping head as claimed in claim 12, wherein the local resolution optoelectronic transducer comprises a line of photodiodes which is displaceable perpendicular to its line direction.

14. An equipping head as claimed in claim 13, wherein the individual photodiodes of the line of photodiodes exhibit rectangular photosensitive surfaces which are elongated perpendicular to the line direction.

15. An equipping head as claimed in claim 12, further comprising: a point light source.

16. An equipping head as claimed in claim 15, further comprising: two point light sources which are disposed at a spacing from one another.

17. An equipping head as claimed in claim 16, further comprising: two laser diodes disposed at a spacing from one another.

18. An equipping head as claimed in claim 13, wherein the point light sources are displaceable, by means of a common mounting, synchronously with the line of photodiodes perpendicular to its line direction.

* * * * *